(12) United States Patent
Ku et al.

(10) Patent No.: US 10,758,946 B2
(45) Date of Patent: Sep. 1, 2020

(54) DEVICE OF CLEANING BRUSH

(71) Applicant: Tung An Development Ltd., Hsinchu County (TW)

(72) Inventors: Chih-An Ku, Hsinchu County (TW); Tzu-Yen Chuang, Hsinchu County (TW); Hung-Chieh Chao, Hsinchu County (TW)

(73) Assignee: Tung An Development Ltd., Hsinchu County (TW)

( * ) Notice: Subject to any disclaimer, the term of this patent is extended or adjusted under 35 U.S.C. 154(b) by 17 days.

(21) Appl. No.: 16/254,860

(22) Filed: Jan. 23, 2019

(65) Prior Publication Data
US 2020/0230656 A1  Jul. 23, 2020

(51) Int. Cl.
| | | |
|---|---|---|
| *H01L 21/02* | (2006.01) | |
| *H01L 21/67* | (2006.01) | |
| *B08B 1/02* | (2006.01) | |
| *B08B 1/00* | (2006.01) | |
| *A46B 9/00* | (2006.01) | |
| *A46B 13/00* | (2006.01) | |
| *B08B 1/04* | (2006.01) | |

(52) U.S. Cl.
CPC .............. *B08B 1/02* (2013.01); *A46B 9/005* (2013.01); *A46B 13/001* (2013.01); *B08B 1/002* (2013.01); *B08B 1/04* (2013.01); *H01L 21/02* (2013.01)

(58) Field of Classification Search
CPC ...... B08B 1/00; H01L 21/67046; H01L 21/02
See application file for complete search history.

(56) References Cited

U.S. PATENT DOCUMENTS

| | | | | |
|---|---|---|---|---|
| 2,198,282 | A * | 4/1940 | Hall ...................... | B24D 13/18 15/230.1 |
| 6,299,698 | B1 * | 10/2001 | Emami .................... | B08B 1/04 134/6 |
| 6,502,273 | B1 * | 1/2003 | Mihara ..................... | B08B 1/04 15/102 |
| 6,574,823 | B1 * | 6/2003 | Stegens ................. | A46B 13/001 15/179 |
| 6,793,612 | B1 * | 9/2004 | Cercone ................... | B08B 3/08 15/102 |
| 7,735,177 | B1 * | 6/2010 | Farber ............... | H01L 21/67046 15/102 |
| 7,779,527 | B2 * | 8/2010 | Yudovsky ......... | H01L 21/67046 29/464 |

(Continued)

*Primary Examiner* — Michael D Jennings
(74) *Attorney, Agent, or Firm* — Jackson IPG PLLC; Demian K. Jackson

(57) ABSTRACT

A cleaning brush comprising a carrier and a cleaning unit is provided. The cleaning unit comprises a plurality of cleaning beans set on a surface of the carrier in a spiral arrangement. A spiral coiling around the carrier from an end of the carrier to the other end is formed. A spiral curve path is formed to coil the carrier circumferentially by extendedly arranging the cleaning beans. Hence, the present invention uses the cleaning beans of the cleaning unit to be set on surface of the carrier. On rotating in a fixed direction, the spiral cleaning unit generates a flow field which not only comprises a vertical flow for an object to be cleaned but also a horizontal flow forming a parallel stream. Thus, dirt can be removed more easily than by using a traditional matrix cleaning device.

8 Claims, 2 Drawing Sheets

(56) References Cited

U.S. PATENT DOCUMENTS

| | | | | |
|---|---|---|---|---|
| 8,778,087 B2* | 7/2014 | Tyrrell | ............... | B08B 11/00 |
| | | | | 134/6 |
| 8,898,845 B2* | 12/2014 | Willis | ............... | B08B 1/04 |
| | | | | 15/102 |
| 10,271,636 B2* | 4/2019 | Withers | ............... | H01L 21/67046 |
| 2002/0121289 A1* | 9/2002 | Brown | ............... | B08B 3/02 |
| | | | | 134/6 |
| 2005/0251936 A1* | 11/2005 | Manfredi | ............... | B08B 1/04 |
| | | | | 15/1.51 |
| 2007/0209135 A1* | 9/2007 | Chen | ............... | H01L 21/67046 |
| | | | | 15/230 |
| 2013/0048018 A1* | 2/2013 | Wargo | ............... | H01L 21/67046 |
| | | | | 134/6 |
| 2013/0133692 A1* | 5/2013 | Withers | ............... | A46B 9/02 |
| | | | | 134/6 |
| 2013/0255721 A1* | 10/2013 | Tyrrell | ............... | H01L 21/02096 |
| | | | | 134/6 |

* cited by examiner

DEVICE OF CLEANING BRUSH

TECHNICAL FIELD OF THE INVENTION

The present invention relates to a cleaning brush; more particularly, to use a plurality of cleaning beans of a cleaning unit to be set on a surface of a carrier in a spiral arrangement, where, on rotating in a fixed direction, the cleaning unit having a spiral form set on a carrier generates a flow field which not only comprises a vertical flow for an object to be cleaned but also a horizontal flow forming a parallel stream; and, thus, dirt can be removed more easily.

DESCRIPTION OF THE RELATED ARTS

A first prior art for cleaning precision electronic components (such as silicon wafer, hard drive disk, semiconductor and CPU chip) is a general device made of an elastic porous sponge of polyvinyl acetal. Multiple protrusions are set on a lateral surface. The tops of the protrusions rotate and contact the surface of a to-be-cleaned object for cleaning. Therein, the protrusions are arranged into a matrix; and the top of each protrusion is formed of a surface layer having high smoothness. Thus, with the coordination of an actuator, the multiple protrusions on the surface are used to clean precision electronic components.

A second prior art comprises a rotatable base, which has an inner surface and an outer surface; and a porous pad material, which covers at least a portion of the outer surface of the rotatable base to be used for removing materials from a substrate. The porous pad material is combined with the rotatable base with the protrusions maintained in an alignment to on the surface of the porous pad material, where the protrusions appear in a matrix arrangement on the surface of the porous pad material. Thus, with the coordination of an actuator, the protrusions are used to clean precision electronic components.

A third/fourth prior art comprises a carrier/brush; and a plurality of cleaning units/nodules, which are set on the surface of the carrier/brush in a matrix arrangement and whose end surfaces are cambered/concave. Thus, the cleaning units/nodules use their cambered/concave surfaces to achieve large contact area, quick cleaning efficiency and high effectivity of dirt removal.

The four prior arts are provided to clean precision electronic components. But, because the third prior art uses protrusions in a matrix arrangement with their tops formed into surfaces having high smoothness as flat planes and the second prior art also has protrusions formed into flat planes in a matrix arrangement, the above two prior arts do not effectively contact the precision electronic components whose surfaces are irregular. Although the first and fourth prior arts use cleaning units/nodules having cambered/concave surfaces on their tops to effectively contact the precision electronic components having irregular surfaces, the cleaning units/nodules are still formed with a matrix arrangement and, hence, the above four prior arts may easily make particles spraying non-directionally during cleaning. Not only the particles are not removed directionally, but also they might be trapped between the cleaning units and the precision electronic components, not to mention the damages thus caused to the precision electronic components. Hence, the prior arts do not fulfill all users' requests on actual use.

SUMMARY OF THE INVENTION

The main purpose of the present invention is to use a plurality of cleaning beans of a cleaning unit to be set on a surface of a carrier in a spiral arrangement, where, on rotating in a fixed direction, the cleaning unit having a spiral form set on a carrier generates a flow field which not only comprises a vertical flow for an object to be cleaned but also a horizontal flow forming a parallel stream; and, thus, dirt can be removed more easily than by using a traditional matrix cleaning device.

To achieve the above purposes, the present invention is a device of cleaning brush, comprising a carrier and a cleaning unit, where the cleaning unit comprises a plurality of cleaning beans set on a surface of the carrier in a spiral arrangement to obtain a spiral coiling around the carrier from an end of the carrier to the other end of the carrier; and a spiral curve path is formed to coil the carrier circumferentially by extendedly arranging the cleaning beans. Accordingly, a novel device of cleaning brush is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
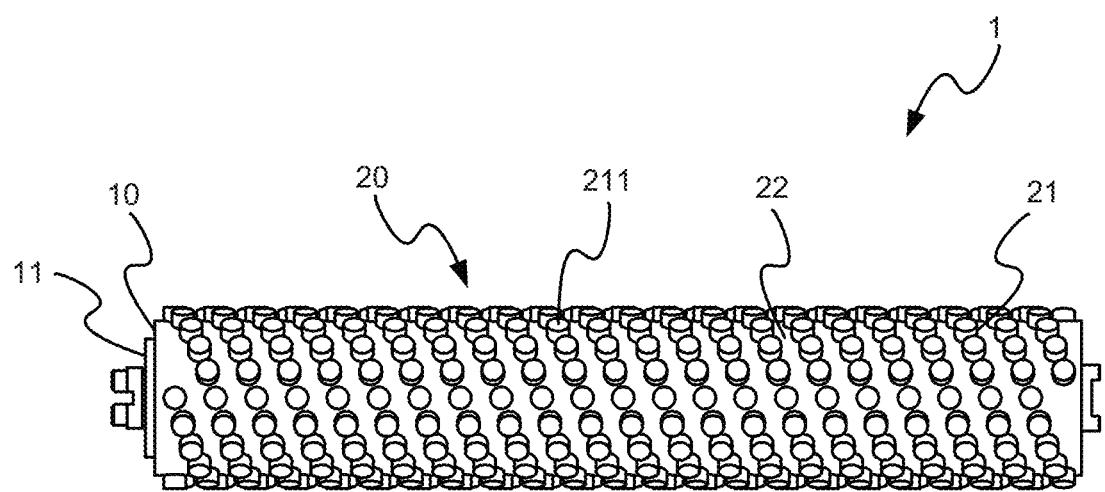
FIG. 1 is the view showing the preferred embodiment according to the present invention.
Figure 2:
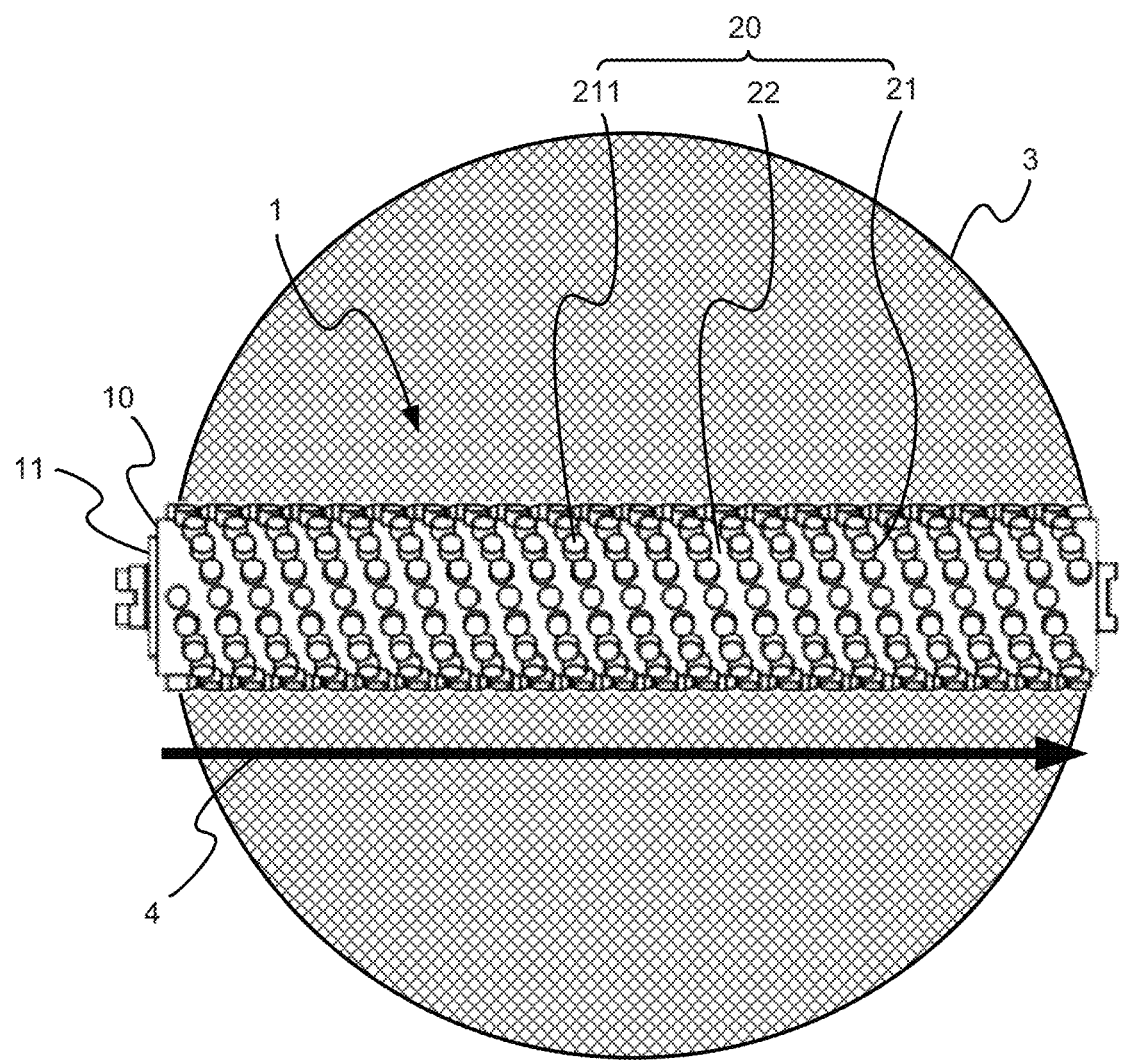
FIG. 2 is the view showing the state-of-use.

Please refer to FIG. 1 and FIG. 2, which are a view showing a preferred embodiment according to the present invention; and a view showing a state-of-use. As shown in the figures, the present invention is a device of cleaning brush, comprising a carrier 10 and a cleaning unit 20. The carrier 10 and the cleaning unit 20 are foamed and formed into a whole one with a soft foam like a composite material, sponge, polyurethane (PU), polyvinyl alcohol (PVA) or a polymer material according to requirement.

The carrier 10 has a cylindrical shape with a sleeve unit 11 set at center.

The cleaning unit 20 is set on an outer edge of the carrier 10. The cleaning unit 20 comprises a plurality of cleaning beans 21 set on a surface of the carrier in a spiral arrangement to form a spiral coiling around the carrier 10 from an end to the other end. The cleaning beans 21 are protruded out a certain distance from the surface of the carrier 10 to form a spiral curve path 22 coiling the carrier 10 circumferentially by extendedly arranging the cleaning beans 210. An end surface of each one of the cleaning beans 21 has a concave arc 211 with a concave at center; and the concave arc 211 has a curvature of 70~99 percent (%). Therein, the cleaning beans have pillar shapes, polygonal shapes, or a combination of pillar and polygonal shapes. Thus, a novel device of cleaning brush is obtained.

On using the present invention, one or a plurality of carriers 10 are combined with a related actuator (not shown in the figure) by the sleeve units 11. The actuator carries the carriers 10 by rolling, and moves according to the position and the requirement for cleaning status. Each one of the cleaning beans 21 of the cleaning unit 20 on the outer edge of the carriers 10 contacts a surface of a relevant precision electronic component 3 for processing required cleaning. In FIG. 2, during a horizontal cleaning motion, the precision electronic component 3 is assumed to rotate at the original place in a clockwise or counterclockwise direction while the cylindrical carrier 10 with the cleaning unit 20 spirally rotating too. Therein, the cleaning unit 20 spirally coiling the carrier 10 pushes dirt (e.g. particles) from an end of the carrier 10 to the other end (as shown by the black arrow 4 in FIG. 2) by using the spiral curve path 22 formed by extendedly arranging the cleaning beans 21 for coiling the carrier 10 circumferentially. Thus, the dirt is pushed directionally to provide a more effective cleaning efficiency. The trapped particles between the device of cleaning brush and the precision electronic component 3 are significantly reduced. Furthermore, because the concave arc 211 at the end surface of each one of the cleaning beans 21 has a curvature of 70~90%, the cleaning beans 21 achieves large contact surface, fast cleaning efficiency and high effectivity of dirt removal.

To sum up, the present invention is a device of cleaning brush, where a plurality of cleaning beans of a cleaning unit is used to be set on a surface of a carrier in a spiral arrangement; on rotating in a certain direction, the cleaning unit having a spiral form set on a carrier generates a flow field which not only comprises a vertical flow for an object to be cleaned but also a horizontal flow forming a parallel stream; and, thus, dirt can be removed more easily than by using a traditional matrix cleaning device.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A cleaning brush device comprising a cylindrical carrier and a cylindrical cleaning unit integrally foamed together, wherein said cleaning unit comprises a plurality of cleaning beans disposed on a surface of the cylindrical carrier in at least one spiral arrangement of adjacent ones of the plurality of cleaning beads coiling around said carrier from an end of said carrier continuously to the other end of said carrier.

2. The device according to claim 1, wherein an end surface of each one of said cleaning beans has a concave arc with a concave at center; and said concave arc has a curvature of 70-99 percent (%).

3. The device according to claim 1, wherein said carrier and said cleaning unit are integrally foamed with a composite material, sponge, polyurethane (PU), polyvinyl alcohol (PVA), or a polymer material foam.

4. The device according to claim 1, wherein each one of said cleaning beans has a pillar shape.

5. The device according to claim 1, wherein each one of said cleaning beans has a polygonal shape.

6. The device according to claim 1, wherein said cleaning beans have pillar shapes and polygonal shapes.

7. The device according to claim 1, wherein a sleeve unit is located at a center of said carrier and said cleaning unit is disposed on an outer surface of said carrier.

8. The device according to claim 1, wherein said cleaning beans are protruded out a certain distance from the surface of said carrier.

* * * * *